(12) United States Patent
Lerner

(10) Patent No.: US 8,921,945 B2
(45) Date of Patent: Dec. 30, 2014

(54) HIGH-VOLTAGE POWER TRANSISTOR USING SOI TECHNOLOGY

(75) Inventor: Ralf Lerner, Erfurt (DE)

(73) Assignee: X-Fab Semiconductor Foundries AG, Erfurt (DE)

(*) Notice: Subject to any disclaimer, the term of this patent is extended or adjusted under 35 U.S.C. 154(b) by 438 days.

(21) Appl. No.: 12/999,028

(22) PCT Filed: Jun. 15, 2009

(86) PCT No.: PCT/IB2009/052544
§ 371 (c)(1),
(2), (4) Date: Mar. 21, 2011

(87) PCT Pub. No.: WO2009/150636
PCT Pub. Date: Dec. 17, 2009

(65) Prior Publication Data
US 2011/0156093 A1    Jun. 30, 2011

(30) Foreign Application Priority Data

Jun. 14, 2008  (DE) .................. 10 2008 028 452

(51) Int. Cl.
*H01L 29/66*   (2006.01)
*H01L 29/739*  (2006.01)
*H01L 29/08*   (2006.01)
H01L 29/06    (2006.01)
H01L 29/78    (2006.01)

(52) U.S. Cl.
CPC ........ *H01L 29/7394* (2013.01); *H01L 29/0834* (2013.01); H01L 29/0696 (2013.01); H01L 29/7803 (2013.01); H01L 29/7812 (2013.01)
USPC ............ 257/378; 257/500; 257/502; 257/565

(58) Field of Classification Search
CPC ............ H01L 29/7395; H01L 29/0696; H01L 29/732; H01L 29/66333
USPC ................ 257/133, 127, 378, 500, 502, 565; 327/112; 438/206
See application file for complete search history.

(56) References Cited

U.S. PATENT DOCUMENTS 5,276,339 A *  1/1994  Fujishima .................... 257/127
5,378,920 A    1/1995  Nakagawa et al.
(Continued)

FOREIGN PATENT DOCUMENTS

DE    19828669 A1   1/2000
DE    19828669 C2   8/2003
(Continued)

OTHER PUBLICATIONS

Sumida H. et al., "A Lateral Insulated Gate Bipolar Transistor Structure with the Collector-Short Region for Improved Latch-Up Performance", Japanese Journal of Applied Physics, Feb. 15, 1996, p. L198 to L200, vol. 35, Pt. 2, No. 2B, Japan Society of Applied Physics, Tokyo, JP.

(Continued)

*Primary Examiner* — Eugene Lee
*Assistant Examiner* — Fang-Xing Jiang
(74) *Attorney, Agent, or Firm* — Hunton & Williams LLP

(57) ABSTRACT

The power transistor configured to be integrated into a trench-isolated thick layer SOI-technology with an active silicon layer with a thickness of about 50 μm. The power transistor may have a lower resistance than the DMOS transistor and a faster switch-off behavior than the IGBT.

12 Claims, 8 Drawing Sheets

Section A-A' of Fig. 5

(56) References Cited

U.S. PATENT DOCUMENTS

| | | | |
|---|---|---|---|
| 5,519,241 A | 5/1996 | Oppermann et al. | |
| 6,191,453 B1 | 2/2001 | Petruzzello et al. | |
| 6,191,456 B1 | 2/2001 | Stoisiek et al. | |
| 6,525,392 B1 * | 2/2003 | Leonardi | 257/500 |
| 6,991,977 B2 * | 1/2006 | Kocon | 438/206 |
| 7,071,516 B2 * | 7/2006 | Terashima | 257/378 |
| 7,400,017 B2 | 7/2008 | Aono et al. | |
| 2002/0171116 A1 * | 11/2002 | Kelberlau et al. | 257/502 |
| 2004/0061534 A1 * | 4/2004 | Yamamoto | 327/112 |

FOREIGN PATENT DOCUMENTS

| | | |
|---|---|---|
| DE | 102005018366 A1 | 11/2005 |
| EP | 0649175 A1 | 4/1995 |
| EP | 0721211 A2 | 7/1996 |
| EP | 1863081 A2 | 12/2007 |

OTHER PUBLICATIONS

German Examination Report for DE 10 2008 028 452.1, dated Feb. 27, 2009.

International Search Report for PCT/IB2009/052544, mailed Sep. 30, 2009.

* cited by examiner

Fig. 6  Section A-A' of Fig. 5
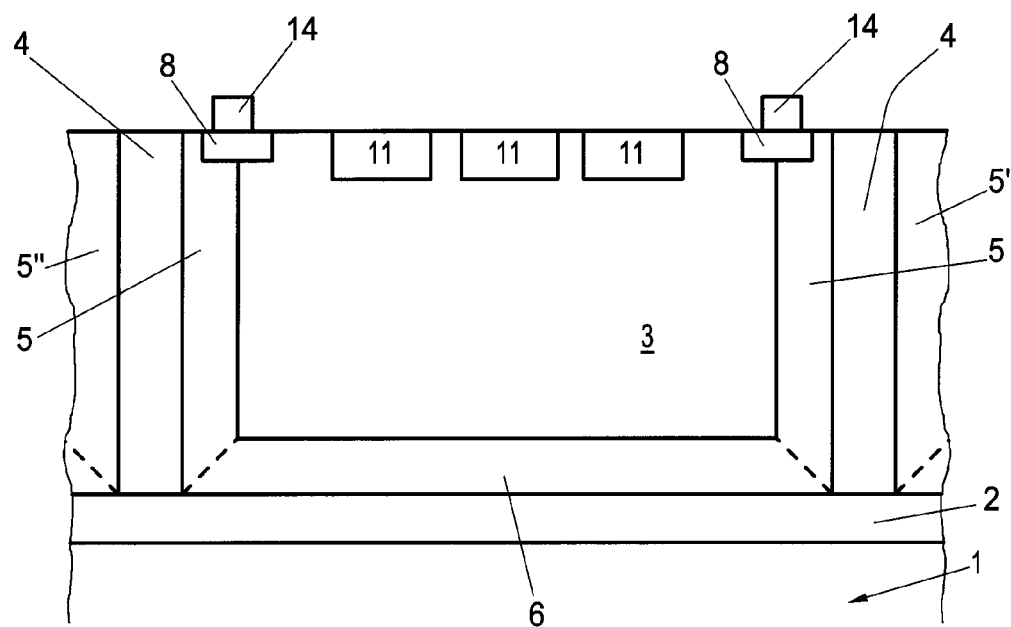
Fig. 7  Section B-B' of Fig. 5
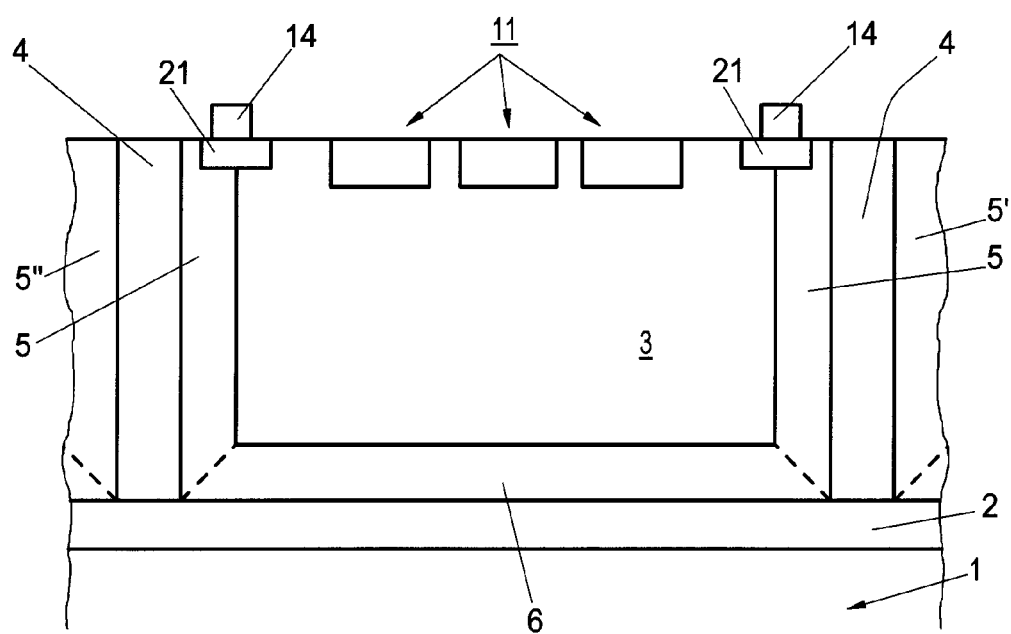

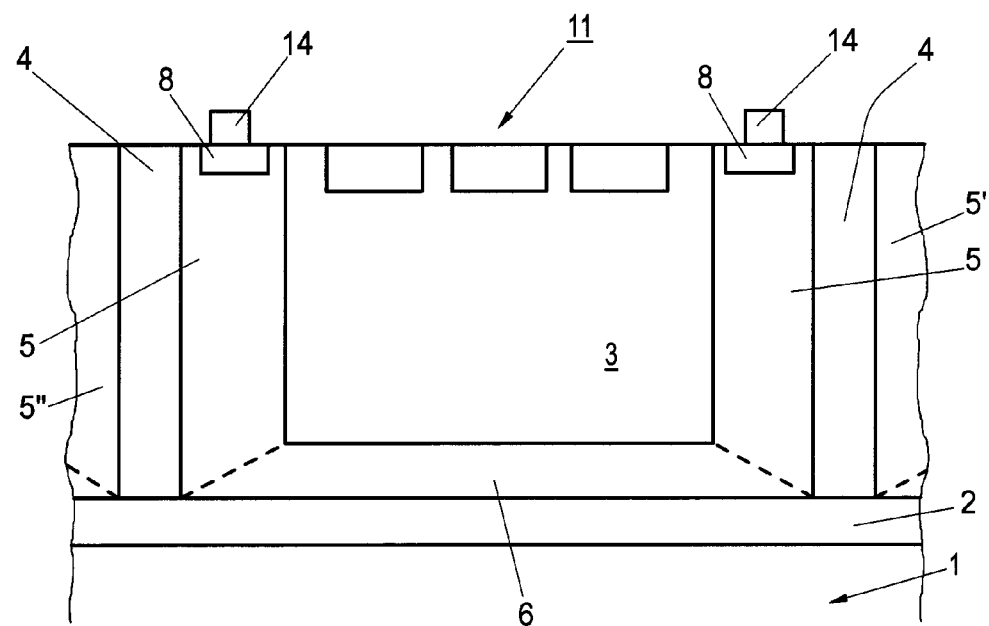
Fig. 9   Section A-A' of Fig. 8
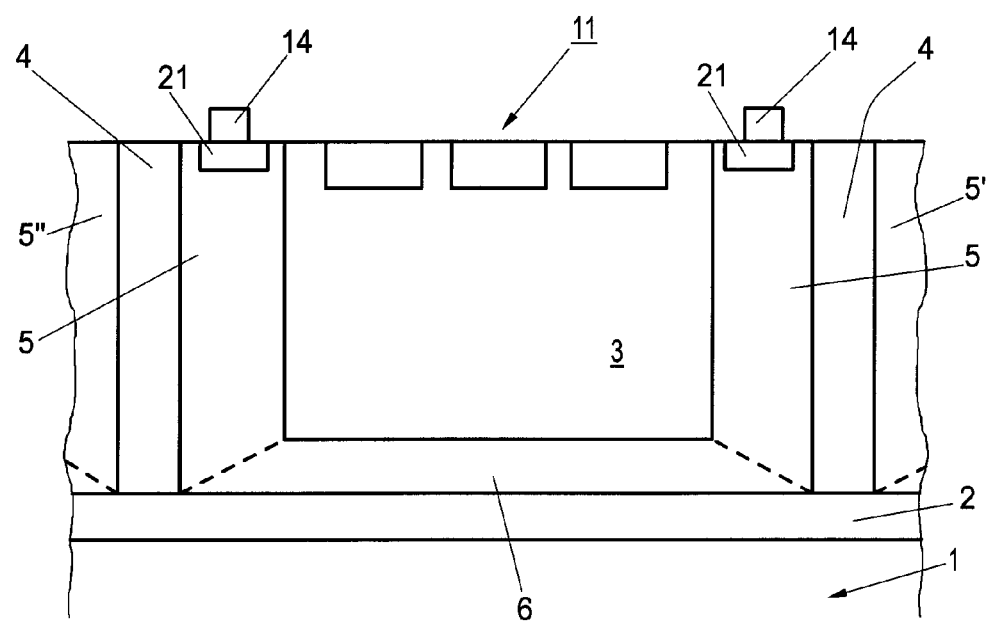
Fig. 10   Section B-B' of Fig. 8

HIGH-VOLTAGE POWER TRANSISTOR USING SOI TECHNOLOGY

CROSS-REFERENCE TO RELATED APPLICATIONS

The application is a U.S. National Stage Application of International Application of PCT/IB2009/052544 filed Jun. 15, 2009, which claims the benefit of German Patent Application No, 10 2008 028 452.1 filed Jun. 14, 2008, the disclosures of which are herein incorporated by reference in their entireties.

FIELD OF THE DISCLOSURE

The invention relates to a power transistor for "high voltages" (typically greater than at least 600 V) which is manufactured in a trench-isolated SOI technology (a high voltage transistor with an inherent technical property of being useable for applications "about at least 700 V").

BACKGROUND OF THE DISCLOSURE

Unipolar transistors have an over square increase of resistance $R_{on}$ with an intended breakthrough voltage according to the estimation:

$$Ron=W/e*\mu*N_D=8.3*10^{-9}V_{BR}^{2.5}$$

wherein
$R_{on}$ resistance;
W width of spatial charge zone;
e elementary charge;
µ movability
$N_D$ doping of drift zone
$V_{BR}$ breakthrough voltage Thus, vertical DMOS transistors as unipolar transistors for use in power electronics have an excessively high resistance for high breakthrough voltages and thus very high power losses.

This can be improved by additional injection of minority charge carriers, as it is the case for IGBTs that are often providing breakthrough voltages of 600 V and above. However, this is detrimental for switching times since the additionally injected charge carriers first have to be recombined when switching off. The components are thus not suited for fast switching applications based on their high switching losses. Furthermore, the IGBT requires a minimum source drain voltage at the level of the flow voltage of the emitter substrate diode in a range of approximately 0.6 V to 0.8 V so that a substantial drain current can flow.

This means that the IGBT has inferior $R_{on}$ properties than a comparable vertical DMOS transistor for small source to drain voltages in the range of below 1 V up to approximately 1.5 V.

Dielectrically insulated (switching) high voltage components with unipolar and bipolar conductive mechanisms are known.

In U.S. Pat. No. 5,378,920, a dielectrically insulated high voltage component is illustrated in a thin high resistance semiconductor layer, wherein the high voltage component is insulated from the rest of the semiconductor wafer through oxide layers 102 and 103. The island 104 in which the component is disposed has very small n-doping, cf. FIG. 26 or FIG. 30 of the cited document. An n-layer with low doping is arranged at the base of the island or above the embedded horizontal oxide 102. In a blocking condition, a high breakthrough voltage can be facilitated through a charge carrier depletion of the layers 104, 106 and 109, cf. the FIGS. 25, 26 of the printed document. In case of FIG. 26, a pt doped layer 120 is arranged adjacent to the vertical oxide layer. The component itself is laterally arranged, wherein the drain area is formed from a pt doped portion 119 adjacent to the vertical isolation. The component is a lateral p-channel DMOS-transistor. In the lateral n-channel IGBT illustrated in FIG. 30 of the printed document the drain area 119*a* or 119*b* is also adjacent to the vertical isolation or oxide layer 103. The drain area itself is made from a highly doped pt area 119*a* which is arranged completely within an n-doped portion 119*a*, EP-A 721 211 also illustrates a horizontally arranged transistor for "high" voltages in SOI wafers. The n-channel-IGBT is thus arranged in a low p doped island 4*a*, wherein a highly doped pt layer 6 is arranged above the horizontally embedded oxide layer 3*a* and laterally from the vertical oxide layer 3*b*. The source area includes an n-doped source portion 8 within a p-trough 7. The drain or the emitter of the IGBT is a p-area 11 within an n-area 9, configured as buffer layer. An n-doped area 10 between the gate electrodes 12 and 13 and the n-buffer 9 is used as a drift zone. The illustrated IGBT (therein FIGS. 1 and 3) or the illustrated MOSFET (therein FIG. 4) includes lateral RESURF-transistors in which the n-doped drift zone 10 is cleared from charge carriers based on the vertical and horizontal spatial charge zones.

Extending from the source electrode 14, the source potential lies over the p-trough 7 and the doped layer is arranged adjacent to the isolation trench 6 or the doped layer above the embedded oxide layer 6 in the volume. Thus, a vertical and a horizontal electric field (RESURF-principle) affect the drift zone 10.

The current flow between source and drain is limited by design to the n-doped areas proximal to the surface.

A lateral IGBT in a trench-isolated SOI wafer is also shown in EP-A 649 175. An n+ doped source area 5, which is embedded in a p-trough or in a p-channel area 6, is arranged on the source side. This p-doped area 6 extends from the surface of the silicon at the side of the isolation trench 4 to the embedded oxide 2. An n-doped island 11 is arranged at the drain side, wherein an n+ doped connection area 14 and an emitter structure 12 are arranged within the island.

An externally controllable resistor circuit allows dividing or switching the current flow to the emitter structure or the connection structure. Thus, a quicker switch-off of the transistor shall be facilitated through external switch-off of the emitter structure. However, this requires an additional resistor circuit.

A similar source structure is illustrated in DE-C 198 28 669. The lateral IGBT illustrated therein implemented in trench-isolated SO wafers is made on the source side from an n doped source zone 4 which is embedded in a base zone of the second conductivity type 3. This base area 3 extends from the surface of the silicon at the side of the isolation trench 12 to the doped anode zone 2 within a surrounding n+ island 13. In the drain zone proximal to the embedded insulation layer 10 there are laterally configured portions of the second conductivity type 11. These portions are configured for quicker removal of the stored charge when switching off the IGBT. However, it is disadvantageous that the embedded portions 11 already have to be introduced during the production of the SOI wafer (during wafer production.) It is an additional disadvantage that the portions 11 are subject to all high temperature processes of the subsequent additional wafer process and thus are subject to high levels of diffusion.

SUMMARY OF THE DISCLOSURE

Thus, there is a need in prior art for a power transistor that is configured to be integrated into a trench-isolated thick film SOI technology with active silicon layers with thicknesses about 50 μm and a vertical drift zone for voltages of about 700 V, wherein the power transistor has a lower resistance than the DMOS transistor and a faster switch-off behavior than the IGBT. About 700 V for a person skilled in the art is meant to be a blocking voltage of at least 600 V.

The claimed invention minds a power transistor that is configured to be integrated in SOI technology and includes a low doped active layer with a thickness of about 50 μm including a plurality of individual source cells which are respectively formed from a trough area with doping that is opposite to the active layer, a highly doped source area and a gate area and a vertical highly doped layer which is adjacent on one side to an isolation trench and on another side to an active layer and an embedded highly doped lateral layer which is arranged above the embedded oxide layer and adjacent thereto, wherein the highly doped lateral layer is connected with the vertical highly doped layer, wherein the active layer, the vertical highly doped layer, the highly doped lateral layer and the source area have the same charge carrier type, and with at least one drain area, wherein a DMOS structure is formed. At least one highly doped IGBT emitter layer is arranged with the opposite charge carrier type as the active layer proximal to the surface of the vertical highly doped layer and extends at least into the highly doped layer, thus forming a pn transistor between the vertical highly doped layer and the highly doped IGBT emitter layer. A contact is provided which is a drain connection of the DMOS transistor and also an IGBT emitter connection for the highly doped IGBT emitter layer that creates a combined DMOS/IGBT power transistor. It is configured for voltages above 600 V in particular about 700 V, thus for "high voltages" as to be understood in the claims. A manufacturing method includes steps for producing this component. The component includes a DMOS-type portion and an IGBT-type portion.

The DMOS-type portion of the component can be varied through the surface or number of source cells. The IGBT-type portion can be varied through the circumferential length of the IGBT emitter areas. This facilitates an optimization with respect to resistance and switching properties.

The invention provides a combination of a unipolar DMOS transistor and an IGBT, wherein both components can be manufactured through the same manufacturing process. The layout of the two components is manufactured substantially in the same way. Changes from one component to the other are very small and thus can be performed easily with respect to processing.

Power transistors according to the claimed invention have the advantages that a current can already flow for small source-drain-voltages over the vertical DMOS-transistor, while a current flow is only possible above the forward voltage of the emitter drift zone transition for pure IGBT structures.

The principle of power transistors according to the invention is generally speaking that a DMOS-transistor with a vertical drift zone with a unipolar conductive mechanism is combined with a lateral IGBT. The drain connection of the vertical DMOS transistor is formed by an embedded highly doped layer and extended to the surface through the vertical highly doped layer at the sidewall of the trench. The DMOS-drain connection can be performed through a contact area. When an additional contact area with a different doping type is introduced within the contact area the additional contact area can function as an emitter area of a lateral IGBT, can inject charge carriers into the drift zone and can increase the conductivity of the drift zone in lateral direction proximal to the surface through the conductivity modulation.

In an advantageous embodiment of the power transistor according to the invention, the highly doped IGBT emitter layer reaches into the highly doped layer and also into the active layer. A pn transition is configured between the vertical highly doped layer and the active layer on the one hand and the IGBT emitter layer on the other hand. Thus, a low resistance and quicker switch-off properties can be achieved in an advantageous manner.

According to another advantageous embodiment of the power transistor according to the invention the highly doped IGBT emitter layer is arranged proximal to the surface of the vertical highly doped layer entirely in the highly doped layer. A pn transition is then formed between the vertical highly doped layer and the IGBT emitter layer. The position of the IGBT emitter within the doping profile of the highly doped vertical layer advantageously facilitates precisely adjusting the doping concentration of the portion of the layer acting as "buffer layer".

According to another advantageous embodiment, the power transistor according to the invention is characterized in that the highly doped IGBT emitter layer is arranged in a trough portion that reaches into the vertical highly doped layer and the active layer. Thus, a pn transition is configured between the trough portion on the one hand and the vertical highly doped layer and the active layer on the other hand. Thus, holes can be emitted into the drift zone in an advantageous manner, wherein the holes substantially increase the charge carrier concentration and thus the conductivity thus reducing the resistance.

The highly doped IGBT emitter layers proximal to the surface of the vertical highly doped layer and possibly of the active layer can be advantageously provided continuously or alternatively additional DMOS-drain areas can be provided proximal to the surface of the vertical highly doped layer. Thus, a simple sizing of the power transistor for particular applications is advantageously provided.

According to another advantageous embodiment, the DMOS drain areas have a smaller surface than the highly doped IGBT emitter layers in order to be able to optimally select the influence of the IGBT emitter layers relative to the DMOS drain areas.

The vertical, highly doped layer can advantageously join proximal to the surface with a particular portion at the IGBT emitter layer reaching to the vertical highly doped layer and the active layer and can join at another portion to the DMOS-drain area. Alternatively, the vertical highly doped layer can join proximal to the surface with a particular portion at the IGBT emitter layer that is enclosed by the vertical highly doped layer and terminates at the surface and is highly doped, and the vertical highly doped layer can connect with another portion at the DMOS-drain area. In both cases a balanced distribution of the IGBT emitter layers and the DMOS-drain areas can be implemented that is optimized for high voltage applications.

The load bearing capabilities in the sense of a blocking capability and a cutoff capability are inherent properties that respectively characterize a component by themselves and also in combination. These are no application indications, not in this field of technology. In this field of technology, a person skilled in the art interprets the blocking capability as a technically measurable property of a component, and according to this property, he selects the component for an application at hand. The blocking capability is indicated as a positive voltage. The cutoff capability is indicated as a negative voltage. Their absolute values can be identical. It is appreciated that a person skilled in the art interprets the stated values as minimum values, thus at least and more.

According to another preferred embodiment, the source cells include a central elongated source cell and at least one additional source cell circumferentially extending about the center source cell at a distance, and the IGBT emitter layers are arranged circumferentially extending about the source cells at a distance.

In alternative advantageous embodiment, the IGBT emitter layers and the possibly provided DMOS drain areas are arranged so that they circumferentially extend about the source cells, wherein they alternate in circumference so that a well distributed area effect of the IGBT emitter layers and of the possibly provided DMOS-drain areas can be implemented.

BRIEF DESCRIPTION OF THE DRAWINGS

The reference signs in the claims are not meant to read the embodiments of the invention as now described with reference to figures into the claims as limitation. The claims are meant to be construed without the bracketed reference signas that enhance understandings.

FIG. 6 illustrates a sectional view along the line A-A' of the fourth embodiment of a transistor according to the invention that is illustrated in FIG. 5;

FIG. 7 illustrates another sectional view along the line B-B' of the fourth embodiment of a transistor according to the invention that is illustrated in FIG. 5;

FIG. 9 illustrates a sectional view along the line A-A' of the fifth embodiment of the transistor according to the invention that is illustrated in FIG. 8; and FIG. 10 illustrates another sectional view along the line B-B' of the fifth embodiment of a transistor according to the invention that is illustrated in FIG. 8.

DETAILED DESCRIPTION OF EMBODIMENTS

Figure 1A:
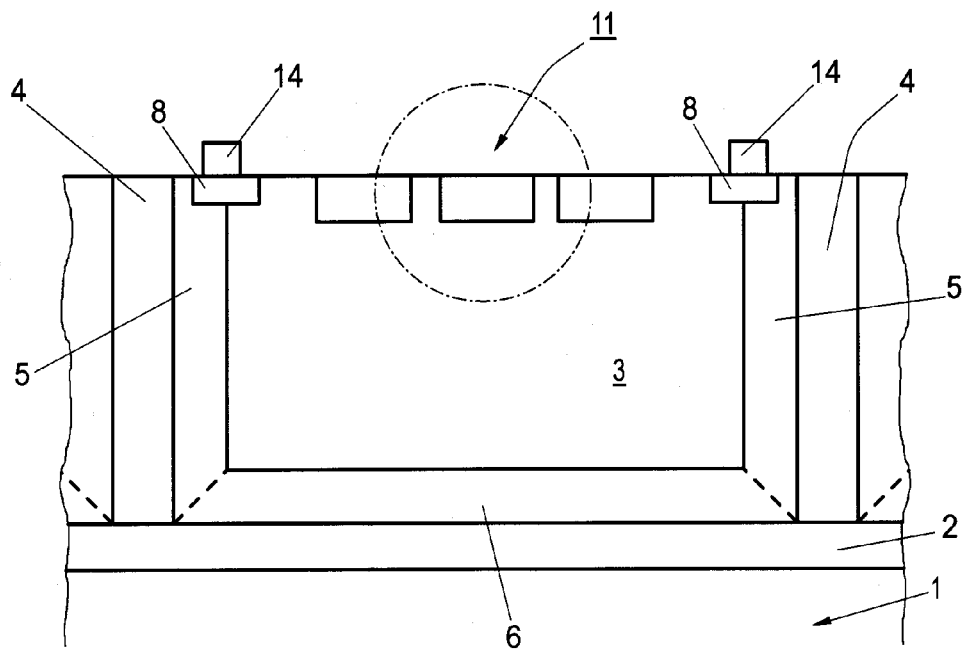
FIG. 1A.

The DMOS transistor illustrated in FIG. 1A incudes a SOT wafer including a support wafer 1, an embedded lateral oxide layer 2 and an active layer 3. The drift zone of the transistor is thus formed by an active layer 3. The transistor is isolated through an isolation trench 4 in lateral direction and insulated in vertical direction through the embedded lateral oxide layer 2 from the rest of the SOI wafer. The active layer adjacent to the isolation trench includes a highly doped vertical layer 5 with the same conduction type as the active layer 3. A plurality of particular source cells 11 is thus used as a source for the transistor, wherein the source cells respectively include a well area 7 with a doping of an opposite conduction type as the active layer 3, a highly doped source area 9 and a gate area 10.

Above the embedded oxide layer 2 there is an embedded highly doped lateral layer 6 with the same conductivity type as the active layer 3 which is electrically connected with low resistance with the wafer surface through the highly doped vertical layer 5 with lateral doping profile and identical conductivity as the highly doped vertical layer 5. The highest doping of the layer 6 is directly at the isolation trench 4 and the doping decreases in a direction towards the source cells 11. An electric contacting of the drain of the transistor can be performed through a contact connection 14 through a drain contact area 8.

For an optimum configuration of the dopings and the distances, the maximum of the electrical field strength is at the transition of the well area 7 to the active layer 3, at the other end of the drift zone, whereas (at the transition from the active layer 3 to the embedded highly doped lateral layer 6 and at the transition from the active layer 3 to the highly doped vertical layer 5) the entire field strength is not yet dissipated over the drift zone, but a small rest is dissipated within the areas 5 and 6.

Figure 1B:
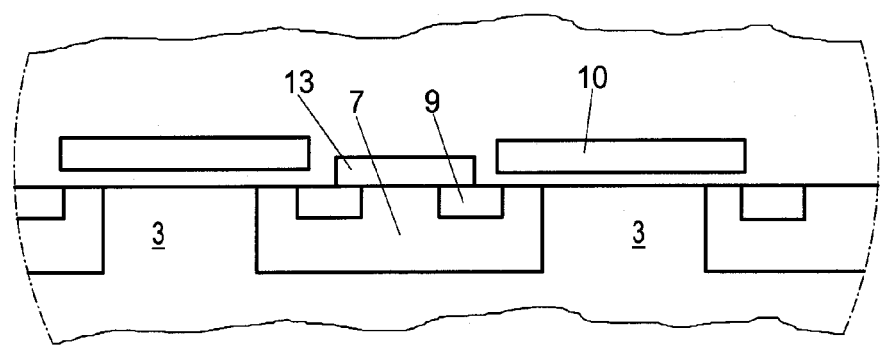
FIG. 1B illustrate a prior art trench-isolated vertical DMOS transistor that is integrated in SOI-technology (not claimed)

FIG. 1B illustrates a detail of the source cell encircled in FIG. 1A and illustrates the well area 7, the source areas 9 and the gate areas 10 and a source connection 13 of the source cell 11 in greater detail.

Figure 2:
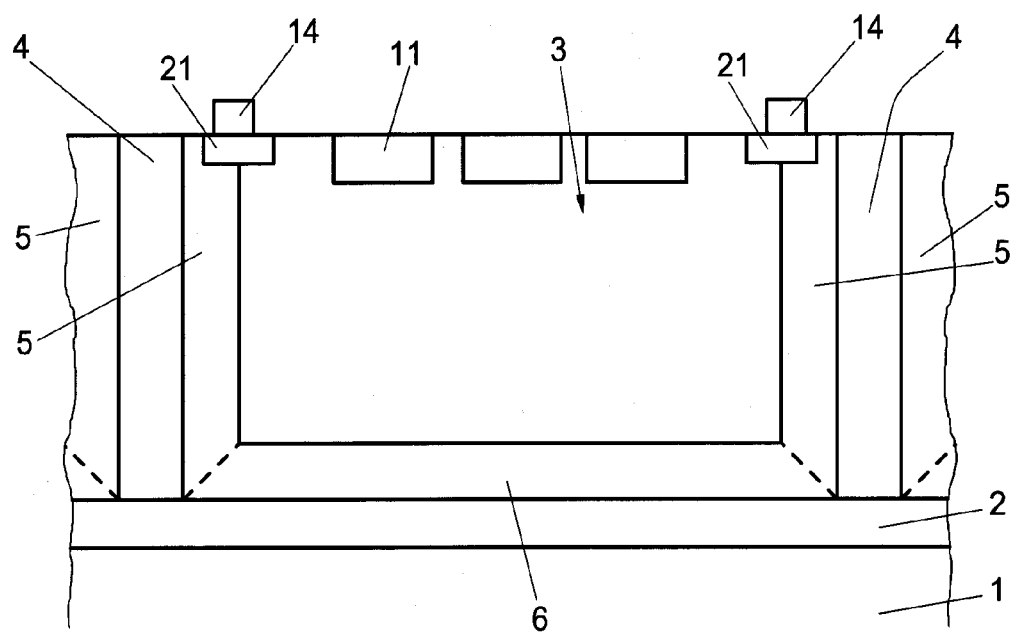
FIG. 2 illustrates an embodiment of a trench-isolated combined transistor integrated in SOI-technology according to an embodiment of the invention.

FIG. 2 illustrates a combined transistor that is extended in comparison to the transistor of FIG. 1A. Like in the transistor according to FIG. 1A the source structure includes a plurality of source cells 11 which in turn include the well area 7, the actual source areas 9 and the gate areas 10. For reasons of clarity only the source cells 11 are illustrated in FIG. 2. Instead of the highly doped drain contact area 8 for the transistor according to FIG. 1A this embodiment of the invention includes an IGBT functional emitter area 21 with a doping with a conductivity type that is opposite to the doping of the active layer 3 or the highly doped layer 5, wherein the IGBT emitter area 21 is contacted through a contact connection 14. Thus, the transistor provided includes a vertical DMOS and a lateral IGBT.

In the power transistor according the FIG. 2 the highly doped IGBT emitter layer 21 is functionally emitting holes, and reaches into the highly doped layer 5 and also into the active layer 3 so that a pn transition is configured between the vertical highly doped layer 5 and the active layer on the one hand and the IGBT emitter layer (called "collector") on the other hand.

Due to the opposite conductivity type of the IGBT emitter area 21 (called "collector") the breakthrough voltage would be reduced through the extension. In case of the simple DMOS transistor (FIG. 1A) the electric field strength has not been dissipated to zero at the transition between the active layer 3 and the drain contact area 8, a large portion of the field strength is dissipated in the drift zone. A small portion of the field strength, however, is dissipated in the highly doped drain contact area 8 for an optimum configuration. In case the IGBT emitter area 21 were inserted at this location with an opposite conductivity type without additional changes, residual field strength would be effective at this transition.

Under these circumstances, it can be provided through a reduced maximum voltage at the transition between the active layer 3 and the IGBT emitter area 21 that the electric field strength is brought to zero. The original dielectric strength with an IGBT emitter area is reached again when an accordingly sized extension of the lateral drift zone (the length of the active layer 3 between the source side well area 7 and the IGBT emitter 21) is provided. The IGBT emitter area 21 must have a greater distance from the well area 7 than the drain contact area 8 for a pure DMOS transistor.

The transistor illustrated in FIG. 2 has a high doping as an IGBT emitter area 21 and is simultaneously used as highly doped connection area. Due to the high doping the emitter area 21 has a high injection rate and thus a high emitter efficiency which can have a detrimental effect e.g. upon the switch-off times.

Figure 3:
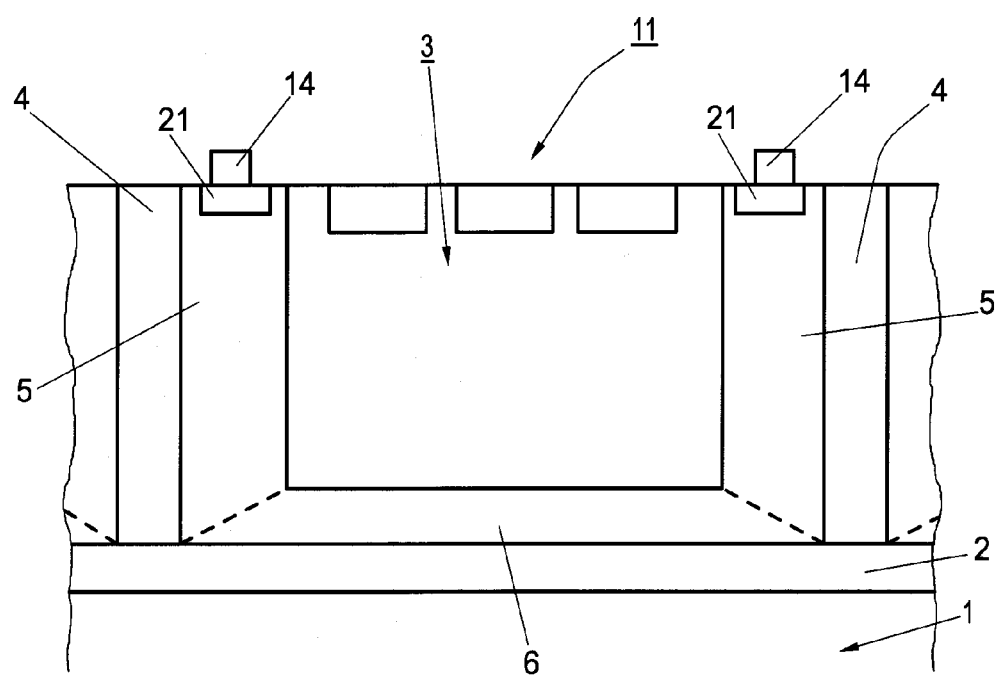
FIG. 3 illustrates a second embodiment of a trench-isolated transistor that is to integrated in SOI-technology according to the invention.

FIG. 3 illustrates a second embodiment of the invention. Differently from the embodiment of FIG. 2 the emitter area 21 is completely integrated into the edge of the highly doped vertical layer 5, wherein the emitter area 21 can be contacted through a contact connection 14. Put differently, in this power transistor the highly doped IGBT emitter layer 21 is arranged proximal to the surface of the vertical highly doped layer 5 completely in the highly doped layer. Thus, a pn transition is configured between the vertical highly doped layer 5 and the IGBT emitter layer. The highly doped vertical layer due to its opposite doping 5 acts as a buffer layer and reduces the emitter efficiency. Through the position of the IGBT emitter 21 within the doping profile of the highly doped vertical layer 5 the doping concentration of the portion of the layer acting as a buffer layer can be precisely adjusted.

In the embodiments according to FIGS. 2 and 3 the highly doped IGBT emitter layers 21 are continuously provided proximal to the surface of the vertical highly doped layer 5 and possibly of the active layer 3.

Figure 4:
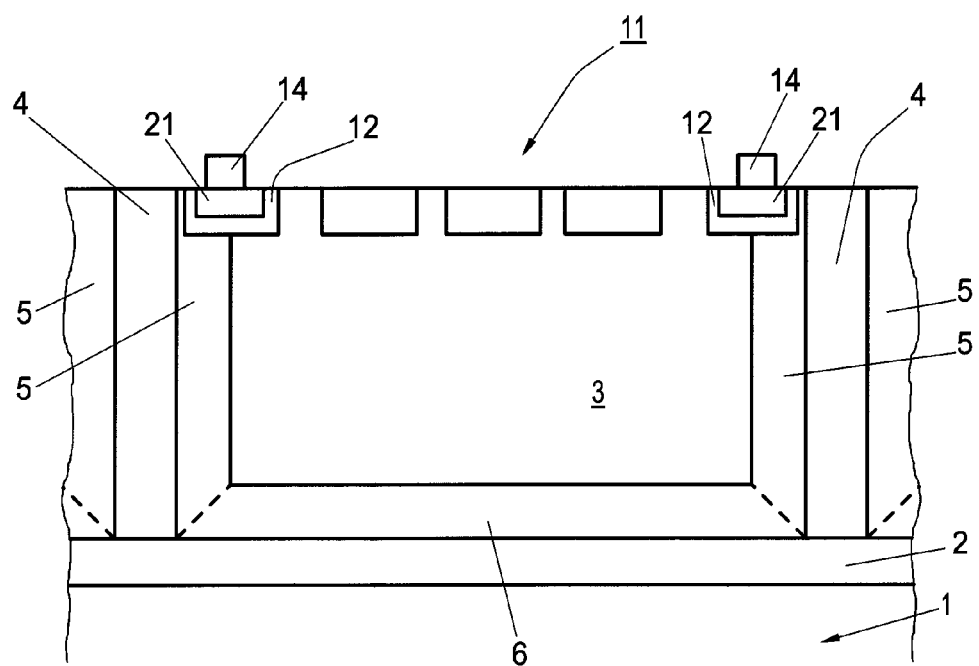
FIG. 4 illustrates a third embodiment of a trench-isolated transistor that is integrated in SOI-technology according to the invention.

FIG. 4 illustrates a third embodiment. Differently from FIG. 2 the highly doped IGBT emitter area 21 is embedded in a lower doped well area 12. Based on the lower doping of the well area 12 the emitter efficiency is reduced. The highly doped IGBT emitter layer 21 is arranged in the well area 12 and reaches into the vertical highly doped layer 5 and the active layer 3, which configures on the one hand a pn transition between the well area 12 and the vertical highly doped layer 5 and the active layer 3 on the other hand.

The doping of the active silicon layer 3 is selected sufficiently low in order to obtain the desired breakthrough voltage of the vertical transistor. The embedded lateral highly doped layer 6 above the embedded lateral insulation layer 2 has the same charge carrier type as the active layer 3, its thickness being very much smaller than the thickness of the active layer 3, e.g. 5 µm. The same applies for the vertical highly doped layer 5. Its thickness is e.g. is also 5 µm for an identical charge carrier type e.g. for a 50 µm thick active layer 3. Thus, the same charge carrier type is provided directly adjacent to the isolation trenches in the entire thickness of the active layer 3 and continuously from the surface up to the embedded highly doped layer 6.

For a positive drain voltage and for an open gate an electron flow occurs from the source connection 13 through the channel area and onward in vertical direction to the embedded highly doped lateral layer 6 that forms the drain connection of the vertical DMOS. Starting at a drain voltage which is greater than the flow voltage of the pn transition formed by the highly doped IGBT emitter area 21 and the active layer 3 of the SOI wafer or of the pn transition between the highly doped IGBT emitter area 21 and the vertical highly doped layer 5 besides the isolation trench in FIG. 3 or of the pn transition between the low doped well area 7 and the active layer 3, holes are emitted into the drift zone, wherein the holes strongly increase the charge carrier concentration and thus the conductivity, thus reducing the resistance.

The DMOS-type portion of the new component can be varied through the surface area or the number of the source cells 11. The IGBT-type portion can be varied through the circumferential length of the IGBT emitter portions 21. This way an optimization with respect to resistance and switching properties is feasible.

For a negative drain voltage a blocking capability can be reached as a function of the configuration of the doping properties around the IGBT emitter area 21. The normal DMOS transistor of FIG. 1 with a negative drain voltage only reaches the flow voltage of the body substrate diode (reverse diode of DMOS) of typically ≤1 V. The configuration illustrated e.g. in FIG. 4 reaches a reverse blocking capability which is determined by the low doping of the transistor well area 7 and the laterally decreasing doping of the vertical highly doped layer 5. When placing the transistor well area 7 further remote from the isolation trench 4 and thus in portions with lower doping, a respectively higher reverse blocking capability can be reached.

Figure 5:
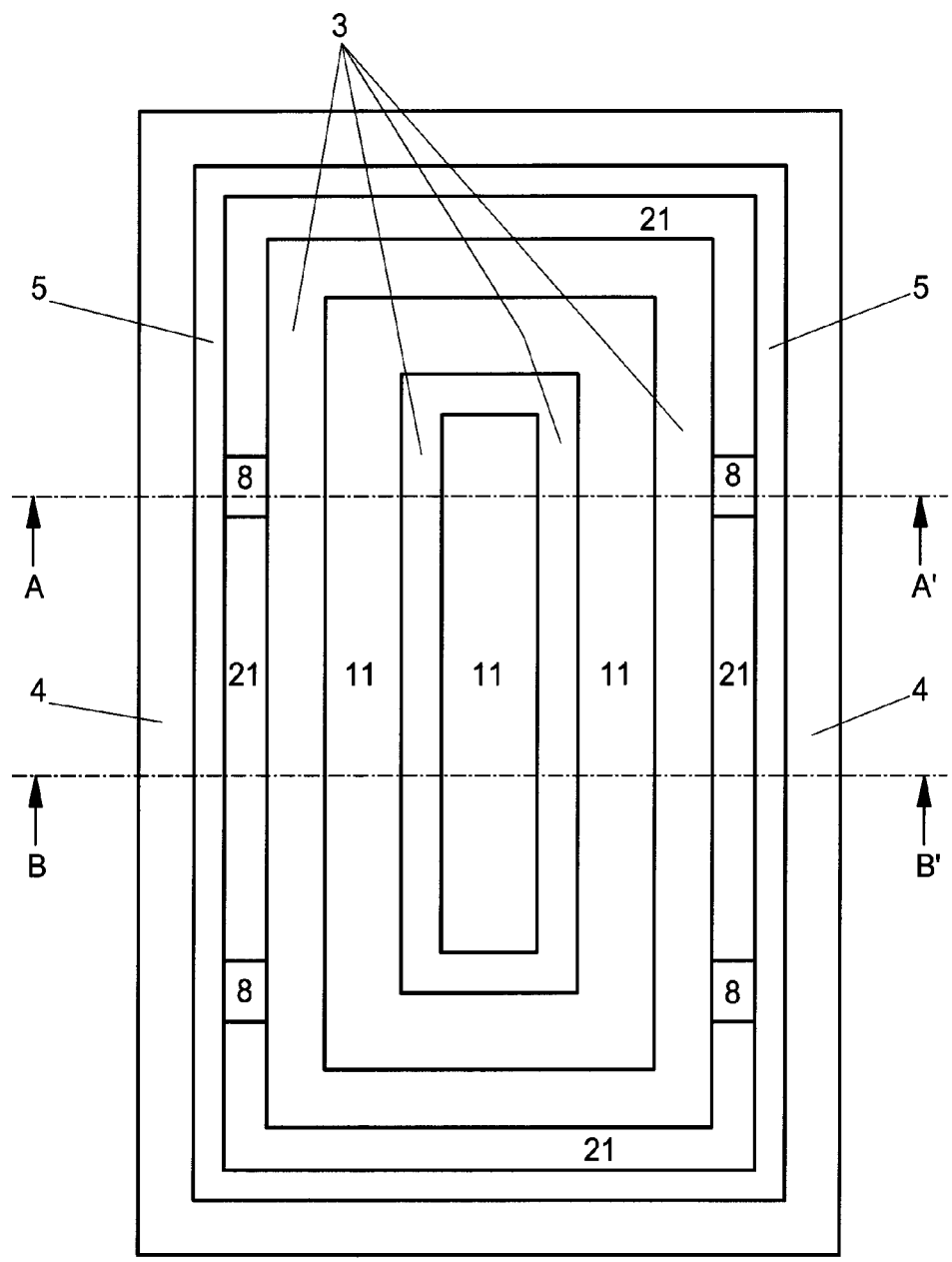
FIG. 5 illustrates a top view of a fourth embodiment of a transistor according to the invention.

FIG. 5 illustrates a top view of a fourth embodiment of a transistor according to the invention.

FIG. 6 illustrates a sectional view along the line A-A' of the fourth embodiment of a transistor according to the invention that is illustrated in FIG. 5, while FIG. 7 illustrates another sectional view along the line B-B' of the fourth embodiment of a transistor according to the invention that is illustrated in FIG. 5.

According to FIG. 5 the power transistor has additional DMOS-drain areas 8 besides the highly doped IGBT emitter layers 21 proximal to the surface of the vertical highly doped layer 5, wherein the IGBT emitter layers 21 and the DMOS-drain areas 8 are contacted through a contact connection 14. The vertical highly doped layer 5 proximal to the surface connects with a particular portion to the IGBT emitter layer 21 reaching to the vertical highly doped layer 5 and the active layer 3 and the vertical highly doped layer 5 connects with another portion to the DMOS-drain area 8. The DMOS-drain areas 8 have a smaller surface than the highly doped IGBT emitter layers 21, wherein the sizing of the surface dimensions is a function of the desired operating parameters of the power transistor.

The embodiment according to FIG. 5 is characterized in that the besides the IGBT emitter area 21 also portions of the DMOS-drain area 8 are provided in parallel. When the DMOS-drain area 8 is not continuously replaced through the emitter area 21 as described in the second embodiment, but only partially as illustrated in FIGS. 5-7, then there are locations at which the emitter 21 is short circuited with the drift zone 3; at this location there is no injection of minority charge carriers and the resistance is slightly deteriorated. The majority charge carriers, however, at this location do not have to overcome a pn transition through which the IGBT typical increase of the basic characteristic curve can only be prevented starting approximately at ≥1 V. Already for small drain source voltages of approximately ≤1 V up to 1.5 V a drain current already flows like for the pure DMOS transistor. Thus, the component achieves a better resistance in the range of small drain source voltages than the structure similar to IGBT.

In the embodiment of the power transistor according to FIG. 5 the source cells 11 include a central elongated source cell and one or plural additional source cells circumferentially extending about the central source cell at a distance and the IGBT emitter layers 21 are arranged so that they extend circumferentially about the source cells at a distance.

The sectional view along the line B-B' according to FIG. 7 of the fourth embodiment of a transistor according to the invention thus corresponds to the sectional view of FIG. 2. Consequently the advantages and remarks apply to the fourth embodiment that were made in the context with the embodiment of FIG. 2.

Figure 8:
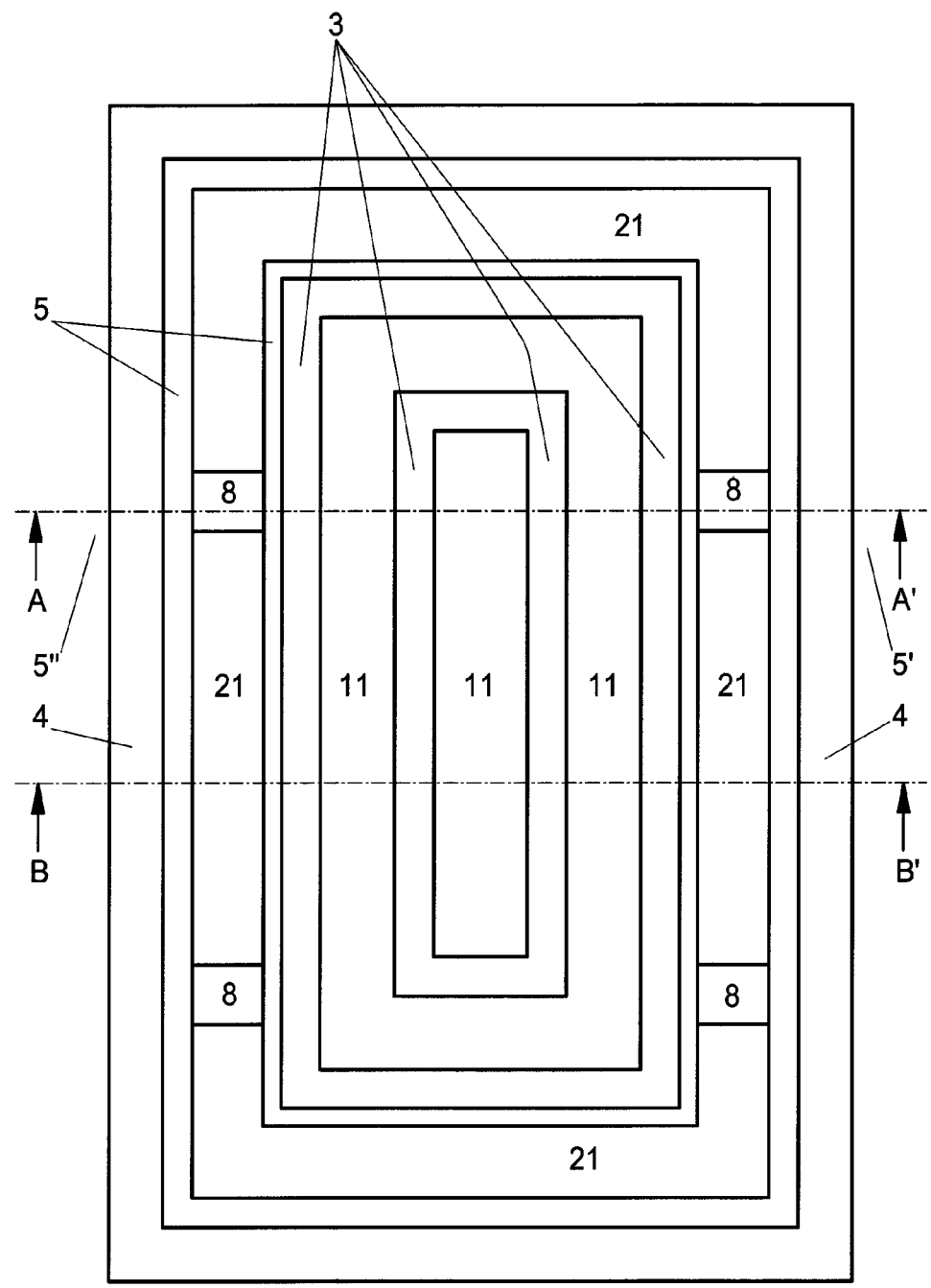
FIG. 8 illustrates a top view of a fifth embodiment of a transistor according to the invention.

FIG. 8 illustrates a top view of a fifth embodiment of a transistor according to the invention.

FIG. 9 illustrates a sectional view along the line A-A' of the fifth embodiment of a transistor according to the invention that is illustrated in FIG. 8. FIG. 10 illustrates another sectional view along the line B-B' of the fifth embodiment of a transistor according to the invention that is illustrated in FIG. 8. On the left of the left trench 4 and on the right of the right trench 4, the next respective identical component is indicated through the beginning of a vertical layer 5' for the right component, and a vertical layer 5" for the left component. Only the respective component with the two vertical layers 5 in the center of the FIGS. 8, 9 and 10 is described.

Also according to FIG. 8, the power transistor includes additional DMOS-drain areas 8, proximal to the surface of the vertical highly doped layer 5, besides including the highly doped IGBT emitter layers 21, wherein the IGBT emitter areas and the DMOS-drain areas 8 are contacted through a contact connection 14. The vertical, highly doped layer 5 connects proximal to the surface with a particular portion to the IGBT emitter layer that terminates at the surface, is highly doped and enclosed by the vertical highly doped layer 5, and the vertical highly doped layer 5 connects to the DMOS-drain area 8 with another portion.

The embodiment according to FIG. 8 also includes portions of the DMOS-drain area 8 in parallel adjacent to the IGBT emitter areas 20 like in the fourth embodiment according to FIG. 5. Differently from the embodiment according to FIG. 5, the emitter areas 21 which are provided in parallel with the DMOS-drain areas 5 and also the drain areas 8 are completely arranged in the layer 5 in the embodiment according to FIG. 8. Also here, there are in turn locations where the emitter 21 is short-circuited with the drift zone 3. Thus, there is no injection at this location of minority charge carriers. The majority charge carriers at this location do not have to overcome a pn transition, so that the IGBT-typical rise of the characteristic output function(s) can be avoided only starting at approximately >1 V. Already for small drain source voltages of approximately ≤1 V up to 1.5 V, a drain current flows like for a plain DMOS transistor.

Thus, the component has a better resistance than the structure similar to IGBT in the range of small drain source voltages.

The sectional view along the line B-B' of the fifth embodiment of a transistor according to the invention illustrated in FIG. 10 thus corresponds to the sectional view of FIG. 3. Consequently, the advantages and remarks that were stated for the embodiment of FIG. 3 apply to the fifth embodiment.

The embodiment of the power transistor according to FIG. 8 includes source cells 11 including a central elongated source cell and one or plural additional source cells extending circumferentially about the central source cell at a distance, and the IGBT emitter layers 21 and the DMOS-drain areas 8 are circumferentially arranged about the source cells, wherein they alternate on a circumference.

The embodiments of the power transistor according to FIGS. 5 and 8 include IGBT emitter layers 21 according to FIGS. 2 and 3, as evident from the sectional views of FIG. 7 or 10.

The IGBT emitter layers, however, can also be arranged in another embodiment in well areas, like the well areas 12 in the embodiment of FIG. 4, wherein the source cells in turn include a center elongated source cell and one or plural source cells that circumferentially extend about the center source cell at a distance, and the IGBT emitter layers are circumferentially arranged about the source cells.

REFERENCE SIGNS AND DESIGNATIONS (EXCERPT)

1 carrier wafer of the SOI wafer
2 embedded oxide layer of the SOI wafer
3 active layer of the SOI wafer; drift area
4 isolation trench (on both sides)
5 vertical highly doped layer, adjacent to the isolation trench (identical charge carrier type as active layer 3)
6 embedded highly doped lateral layer (identical charge carrier type as active layer 3)
7 well area (doping with opposite charge carrier type compared to active layer 3)
8 drain area (identical charge carrier type as active layer 3)
9 source area (identical charge carrier type as active layer 3)
10 gate area
11 source cell
12 well with other doping
13 source and body connection (metallization)
14 connection for DMOS-drain 8 and IGBT collector 21 (metallization).
21 IGBT emitter layer as collector (highly doped, opposite charge carrier type as active layer 3)

I claim:

1. A combined DMOS/IGBT power transistor for integration in SOI-technology and configured for high voltages, the power transistor comprising:
   a low doped active layer (3) with a thickness of about 50 µm;
   a plurality of individual source cells (11), each comprising:
   a well area (7) comprising a doping that is opposite to the active layer (3) to form a pn-transition between the well area (7) and the active layer (3),
   a highly doped source area (9), and
   a gate area (10);
   a highly doped vertical layer (5), one side thereof being adjacent to an isolation trench (4) and another side thereof being adjacent to the active layer (3);
   a highly doped embedded lateral layer (6) arranged above and adjacent to an embedded oxide layer and below the low doped active layer (3), wherein the highly doped embedded lateral layer (6) is connected to the highly doped vertical layer (5) and the active layer (3), the highly doped vertical layer (5), the highly doped embedded lateral layer (6) and the source area (9) having the same charge carrier type;
   a drain area (8) forming a DMOS-drain area connected to the highly doped vertical layer (5), said drain area and the connection forming a vertical DMOS structure that further comprises the low doped active layer (3), the plurality of individual source cells (11), the highly doped vertical layer (5), and the highly doped embedded lateral layer (6);
   a highly doped IGBT collector (21) with an opposite charge carrier type as the low doped active layer (3), proximal to a surface of the highly doped vertical layer (5), the IGBT collector reaching into the highly doped vertical layer (5) to form a pn-transition between the highly doped vertical layer (5) and the highly doped IGBT collector (21) forming a part of a lateral IGBT structure that further comprises the low doped active layer (3) and the plurality of individual source cells (11);
   a contact (14) connected to at least a portion of the DMOS-drain area (8) and at least a portion of the highly doped IGBT collector (21), the contact thereby forming a common connection for the DMOS-drain area (8) and the IGBT collector (2) and wherein the DMOS-drain area (8) and the highly doped IGBT collector (21) are arranged proximal to the surface of the highly doped vertical layer (5) and the DMOS-drain area (8) has a smaller top surface extension than the highly doped IGBT collector (21).

2. The power transistor according to claim 1, wherein the highly doped IGBT emitter layer (21) reaches into the highly doped layer (5) and also reaches into the active layer (3), and a pn transition is provided between the vertical highly doped layer (5) and the active layer on one side and the IGBT emitter layer on the other side.

3. The power transistor according to claim 1, wherein the highly doped IGBT emitter layer (21) is arranged proximal to the surface of the vertical highly doped layer (5) entirely in the highly doped layer (5) and a pn transition is configured between the vertical highly doped layer (5) and the IGBT emitter layer.

4. The power transistor according to claim 3, wherein the highly doped IGBT emitter layer (21) is arranged in the well area (7) which reaches into the vertical highly doped layer (5) and the active layer (3) which forms a p-n transition between the well area (7) on one side and the vertical highly doped layer (5) and the active layer (3) on the other hand side.

5. The power transistor according to claim 1, wherein continuous highly doped IGBT emitter layers (21) are provided proximal to a surface of the vertical highly doped layer (5).

6. The power transistor according to claim 1, wherein the highly doped vertical layer (5) joins proximal to the surface thereof with a particular portion thereof with the IGBT collector (21) and with another portion at the DMOS-drain area (8).

7. The power transistor according to claim 6, wherein the highly doped vertical layer (5) joins proximal to the surface thereof with the particular portion thereof with the IGBT collector (21), the collector terminates at the surface of the vertical layer and is enclosed by the highly doped vertical layer (5) from below.

8. The power transistor according to claim 1, wherein the plurality of source cells (11) includes a central, elongated source cell and at least one additional source cell extending around the central source cell at a first distance, and wherein the IGBT collector (21) is arranged to extend around the source cells at a second distance.

9. The power transistor according to claim 8, wherein the IGBT collector (21) and the DMOS-drain areas (8) are arranged laterally outside the source cells and alternate with one another along a surrounding path.

10. The power transistor according to claim 1, having a technically measurable parameter of a blocking voltage above 600 V.

11. The power transistor according to claim 1, including the technically measurable parameter of a reserve breakthrough voltage of less than minus 600 V.

12. The power transistor of claim 6, wherein the IGBT collector (21) and the DMOS-drain area (8) reach into the low doped active area (3).

* * * * *